United States Patent [19]

Johnson et al.

[11] 4,105,477

[45] Aug. 8, 1978

[54] DOPING OF (Hg,Cd)Te WITH A GROUP VA ELEMENT

[75] Inventors: Eric Shanks Johnson; Joseph Lawrence Schmit, both of Minnetonka, Minn.

[73] Assignee: Honeywell, Inc., Minneapolis, Minn.

[21] Appl. No.: 846,739

[22] Filed: Oct. 31, 1977

Related U.S. Application Data

[62] Division of Ser. No. 757,266, Jan. 6, 1977, abandoned.

[51] Int. Cl.² .......................................... H01L 21/04
[52] U.S. Cl. .................................. 148/187; 148/188; 136/89 ST; 252/62.3 ZT; 357/11
[58] Field of Search ..................... 75/134 H, 135, 139; 136/89 ST, 89 CD; 148/1.5, 33, 186, 187, 188, 189; 252/62.3 ZT; 357/11

[56] References Cited

U.S. PATENT DOCUMENTS

| 3,218,203 | 11/1965 | Ruehrwein | 148/174 X |
| 3,312,571 | 4/1967 | Ruehrwein | 148/174 X |
| 3,496,024 | 2/1970 | Ruehrwein | 148/33.5 X |

*Primary Examiner*—G. Ozaki
*Attorney, Agent, or Firm*—John S. Munday

[57] ABSTRACT

Mercury cadmium telluride having a quantity of an acceptor material selected from Group VA of the Periodic Table, consisting of nitrogen, phosphorus, arsenic and antimony and bismuth dispersed therein, preferably in an amount sufficient to measurably increase the acceptor concentration of the semiconductor. Most preferred are phosphorus, arsenic and antimony. Also disclosed are junctions formed by two adjacent regions of mercury cadmium telluride in which one of the regions contains an acceptor concentration increasing amount of nitrogen phosphorus, arsenic, bismuth or antimony. A method is disclosed which permits diffusion of these additives into a body of already formed mercury cadmium telluride.

20 Claims, 6 Drawing Figures

HALL COEFFICIENT VERSUS INVERSE TEMPERATURE FOR SAMPLES TAKEN FROM SURFACE AND CORE REGIONS OF $Hg_{0.6}Cd_{0.4}Te$ DIFFUSED WITH P AT 650°C AND SLOW COOLED, AND FOR UNDOPED MATERIAL SUBJECTED TO A SIMILAR HEAT TREATMENT.

DOPING OF (Hg,Cd)Te WITH A GROUP VA ELEMENT

ORIGIN OF THE INVENTION

This invention was made in the course of a contract with the Department of the Air Force.

This is a division of application Ser. No. 757,266, filed Jan. 6, 1977, now abandoned.

BACKGROUND OF THE INVENTION

The present invention is concerned with mercury cadmium telluride semiconductor devices. In particular, the present invention is directed to a method of introducing impurities into mercury cadmium telluride. For the purposes of this specification, the common chemical equations for mercury cadmium telluride (Hg,Cd)Te or $Hg_{1-x}Cd_xTe$, will be used.

Mercury cadmium telluride is an intrinsic photodetector material which consists of a mixture of cadmium telluride, a wide gap semiconductor ($E_g=1.6eV$), with mercury telluride, which is a semimetal having a negative energy gap of about $-0.3eV$. The energy gap of the alloy varies approximately linearly with $x$, the mole fraction of cadmium telluride in the alloy. By properly selecting $x$, it is possible to obtain (Hg,Cd)Te detector material having a peak response over a wide range of infrared wavelengths. High performance (Hg,Cd)Te detectors have been achieved for wavelengths of from about 1 to about 30 microns.

Mercury cadmium telluride photodiodes have found increasing use in recent years. With this increasing use, more sophisticated photodiodes such as (Hg,Cd)Te reach-through avalanche photodiodes have become desirable. As a result, improved methods of forming PN junctions in (Hg,Cd)Te have become highly desirable. Also, other uses of either P-type or N-type material doped to various degrees have found uses not previously considered.

In another area of technical development, (Hg,Cd)Te is of particular importance as a detector material for the important 8 to 14 micron atmospheric transmission "window." Extrinsic photoconductor detectors, noteably mercury doped germanium, have been available with high performances in the 8 to 14 micron wavelength interval. These extrinsic photoconductors, however, require very low operating temperatures of below 30° K. (Hg,Cd)Te intrinsic photodetectors, having a spectral cutoff of 14 microns, on the other hand, are capable of high performance at 77° K.

The possible application of (Hg,Cd)Te as an intrinsic photodetector material for infrared wavelengths was first suggested by W. G. Lawson, et al., *J. Phys. Chem. Solids*, 9, 325 (1959). Since that time extensive investigation of (Hg,Cd)Te detectors has been achieved for wavelengths from about 1 to 30 microns.

Despite the potential advantages of (Hg,Cd)Te as an infrared detector material, (Hg,Cd)Te photodetectors have recently found wide use in infrared detector systems. A difficulty with (Hg,Cd)Te has been in preparing high quality, uniform material in a consistent manner. The preparation of (Hg,Cd)Te crystals having the desired conductivity type, has been found to be particularly difficult.

Several properties of the (Hg,Cd)Te alloy system cause the difficulties which have been encountered in preparing (Hg,Cd)Te. First, the phase diagram for the alloy shows a marked difference between the liquidus and solidus curves, thus resulting in segregation of CdTe with respect to HgTe during crystal growth. Crystal growth methods, which involve slow cooling along the length of an ingot, produce an inhomogeneous body of (Hg,Cd)Te. Second, the high vapor pressure of Hg over the melt requires special care to maintain melt stoichiometry. Third, the segregation of excess Te can give rise to a pronounced constitutional super cooling.

A number of bulk growth techniques have been investigated. Zone melting methods for preparing (Hg,Cd)Te have been developed by B. E. Bartlett, et al., *J. Mater. Sci.*, 4, 266 (1969); E. Z. Dzuiba, *J. of Electrochem. Soc.*, 116, 104 (1969); and R. Ueda, et al, *J. Crystal Growth*, 13/14, 668 (1972). Still other bulk growth techniques for (Hg,Cd)Te have been described by J. Blair, et al., *Conference on Metallurgy of Elemental and Compound Semiconductors*, 12, 393 (1961) and J. C. Woolley, et al., *J. Phys. Chem. Solids*, 13, 151 (1960).

All of the bulk growth techniques require additional post-growth processing steps to produce photodetectors. The crystal must be sliced and the surface prepared by polishing and etching. The (Hg,Cd)Te slice is then epoxied to a substrate such as germanium. This is a particular disadvantage in the fabrication of detector arrays, since it is inconvenient, expensive and generally unsatisfactory to fabricate arrays by assembling discrete detector elements. The epoxy layer, in addition to complicating detector and detector array fabrication, results in a thermal barrier between the (Hg,Cd)Te and the substrate. This thermal barrier can adversely affect performance when significant heating occurs during use.

Epitaxial growth techniques defined below offer the possibility of eliminating the epoxy layer and avoiding many of the post-growth processing steps required for bulk growth techniques. An epitaxial layer is a smooth continuous film grown on a substrate, such that the film crystal structure corresponds to and is determined by that of the substrate. The desired epitaxial layer is single crystal with uniform thickness and electrical properties. The substrate has a different composition or electrical properties from that of the epitaxial layer.

Vapor phase epitaxial growth techniques have been investigated in an attempt to grow (Hg,Cd)Te layers. One vapor phase epitaxial growth technique which has been investigated is the vapor transport of the three constituent elements to a substrate with compound and alloy formation at that point. The vapor transport generally involves additional materials as transport agents, such as halogens. The vapor transport techniques have been described by R. Ruehrwein (U.S. Pat. No. 3,496,024), G. Manley, et al. (U.S. Pat. No. 3,619,282), D. Carpenter, et al. (U.S. Pat. No. 3,619,283) and R. Lee, et al. (U.S. Pat. No. 3,642,529).

Another vapor phase epitaxial growth process has been studied by R. J. Hager, et al. (U.S. Pat. No. 3,725,135) and by G. Coehn-Solal, et al., *Compt. Rend.*, 261, 931 (1965). This approach involves an evaporation—diffusion mechanism without the use of any additional materials as transport agents. In this method, a single crystal wafer of CdTe is used as the substrate, and either HgTe or (Hg,Cd)Te is used as the source. At a high enough temperature the material evaporates from the source and migrates in the vapor phase to the CdTe substrate, on which it deposits epitaxially.

In spite of their apparent advantage, epitaxial films of (Hg,Cd)Te formed by vapor phase techniques have been less satisfactory than (Hg,Cd)Te crystals formed by bulk growth because of a compositional gradient along the crystal growth direction which has made them less desirable for detector applications.

Other epitaxial growth techniques have also been attempted. R. Ludeke, et al., *J. Appl. Phys.*, 37, 3499 (1966) grew epitaxial films of (Hg,Cd)Te on single crystal barium fluoride substrates by flash evaporation in vacuum. The samples were grown for studies of optical properties. The technique is probably not practical for the preparation of detector material. H. Krause, et al., *J. Electrochem. Soc.*, 114, 616 (1967), deposited films of (Hg,Cd)Te on single crystal substrates of sodium chloride, germanium and sapphire by means of cathodic sputtering. The resulting films were amorphous as deposited and became crystalline only upon subsequent annealing. The formation of (Hg,Cd)Te by mercury ion bombardment of CdTe has been attempted by N. Foss, *J. Appl. Phys.*, 39, 6029 (1968). This approach was not successful in forming an epitaxial layer.

Another epitaxial growth technique, liquid phase epitaxy, has been used with success in growing other semiconductor materials and in growing garnets for bubble memory applications. In particular, liquid phase epitaxy has been used successfully in the preparation of gallium arsenide, gallium phosphide and lead tin telluride. These materials generally differ from (Hg,Cd)Te, however, in that they (GaAs and GaP) do not have all the severe segregation problem present in (Hg,Cd)Te nor do they have the problem of high vapor pressure of mercury over the melt.

U.S. Pat. No. 3,718,511 by M. Moulin, which describes liquid phase epitaxial growth of lead tin telluride and lead tin selenide, suggests that analogous growth arrangements could be made for the alloys zinc selenide telluride and (Hg,Cd)Te. The patent, however, gives specific examples of liquid phase epitaxy only for lead tin telluride and lead tin selenide. Despite the suggestion by Moulin, prior attempts to grow (Hg,Cd)Te by liquid phase epitaxy have proved unsuccessful. Thermodynamic considerations or experimental difficulties have prevented achievement of detector-grade (Hg,Cd)Te material.

However, high quality detector-grade (Hg,Cd)Te epitaxial layers have been formed by the liquid phase epitaxial growth techniques of U.S. Pat. No. 3,902,924. A liquid solution of mercury, cadmium and tellurium is formed and is contacted with a substrate. The liquid solution in the boundary layer next to the substrate has a liquidus composition which is corresponding to the solidus composition of the desired (Hg,Cd)Te layer at the growth temperature by the appropriate tie line. Supersaturation produces growth of a layer of (Hg,Cd)Te on the substrate.

The electrical properties of mercury cadmium telluride can be altered either by changing the stoichiometry or by foreign impurity doping. It is generally theorized that interstitial mercury and cadmium produce N-type conductivity while mercury and cadmium vacancies as well as tellurium interstitials produce P-type conductivity. In Applied Physics Letters 10, 241 (1967) C. Verie and J. Ayas suggested the formation of PN junctions in mercury cadmium telluride by the adjustment of stoichiometry. The formation of PN junctions by diffusion of foreign impurities into mercury cadmium telluride is complicated by two requirements. First, it has been thought that the impurity must be able to be diffused into mercury cadmium telluride at a reasonably low temperature. This is necessary to prevent excessive dissociation of the mercury telluride, which would drastically change stoichiometry. The relatively small dissociation energy of mercury telluride greatly complicates the diffusion and annealing procedures for junction preparation. Second, the impurity atom must not completely replace mercury in the lattice and form yet another compound rather than simply dope the crystal. This problem is also due to the small dissociation energy of mercury telluride. Examples of compounds formed by impurities include $In_2Te_3$, $TeI_2$ and $TeI_4$. None of these materials affect the donor or acceptor concentration in the manner desired.

In U.S. Pat. No. 3,743,553, PN junctions are formed in an N-type body of mercury cadmium telluride by depositing a layer of gold on a surface of the N-type body and heating the body to diffuse the gold into the body, thereby forming a region of P-type conductivity in the N-type body.

The formation of PN junctions in (Hg,Cd)Te is complicated by the small dissociation energy of mercury telluride in the alloy. So too are the difficulties incurred in adjusting carrier concentrations of adjoining regions of the same type. The formation of PN junctions must not cause excessive dissociation of the mercury telluride, since this will adversely affect the electrical and optical properties of the resulting devices.

Several techniques have been developed for forming N-type layers on a P-type body of (Hg,Cd)Te. Among these techniques are bombardment with protons, electrons or mercury ions. These techniques create an N-type layer by creating a damage induced donor state. These techniques are described in Foyt, et al., "Type Conversion and N-P Junction Formation in (Hg,Cd)Te Produced by Proton Bombardment," Appl. Phys. Let., 18, 321 (1971); McIngailis, et al., "Electron Radiation Damage and Annealing of (Hg,Cd)Te at Low Temperatures," J. Appl. Phys., 44, 2647 (1973); and Fiorito, et al., "Hg-Implanted (Hg,Cd)Te Infrared Low Photovoltaic Detectors in the 8 to 14 Micron Range," Appl. Phys. Let., 23, 448 (1973).

Another technique of forming N-type on P-type (Hg,Cd)Te is described by Marine, et al., "Infrared Photovoltaic Detectors from Ion-Implanted (Hg,Cd)Te," Appl. Phys. Let., 23, 450 (1973). This method involves aluminum ion implantation and subsequent anneal at 300° C for 1 hour to form an N-type in a P-type (Hg,Cd)Te body.

Formation of P-type layers on N-type (Hg,Cd)Te, is limited to two techniques. One common method of forming P-type regions in N-type (Hg,Cd)Te is by depositing a gold layer on a surface of the N-type body and then heating the body to diffuse the gold, thereby forming a region of P-type conductivity. This method is described in U.S. Pat. No. 3,743,553, by M. W. Scott, et al. While this method is generally satisfactory, it does have some shortcomings. In particular, it is difficult to form very abrupt, well-defined PN junctions because gold diffuses extremely rapidly in (Hg,Cd)Te. Devices such as reach-through avalanche photodiodes and wide bandwidth photodiodes, therefore, are difficult, if not impossible to fabricate using gold diffusion.

Another method has been proposed in a commonly owned copending application, filed Mar. 1, 1976, having Ser. No. 662,293, now U.S. Pat. No. 4,003,759. That application discloses a method of introducing acceptor impurities into a region of an (Hg,Cd)Te body. This method allows fabrication of an abrupt, well-defined PN junctions in (Hg,Cd)Te, and comprises implanting gold ions into the (Hg,Cd)Te body and heat treating the body at a relatively low temperature for a short duration.

SUMMARY OF THE INVENTION

It has now been discovered that mercury cadmium telluride can be made with an increased acceptor concentration by the addition of an acceptor material selected from Group VA of the periodic chart. Most preferred are those members selected from the group consisting of phosphorous, arsenic and antimony. Preferably, the amount of acceptor material ranges from $10^{10}$ atoms per cubic centimeter to $10^{20}$ atoms per cubic centimeter. The Group VA atoms are present at lattice sites in the mercury cadmium telluride and, in fact, is substituted for tellurium in the crystal.

It has been discovered that the junctions can be formed from a body of mercury cadmium telluride in which a region of the semiconductor is modified to contain an acceptor material dispersed therein in an amount sufficient to measurably increase the acceptor concentration of the region, the acceptor material being selected from Group VA atoms, and preferably from the group consisting of phosphorous, arsenic and antimony. Where an adjacent second region is N-type and the acceptor concentration is sufficient to render the treated region P-type, the interface therebetween forms an NP junction. Where the region adjacent to the treated region is P-type already, and the increased acceptor concentration caused by the addition of the acceptor material of this invention renders the semiconductor P+ type, a P−P+ type junction is formed.

A method of adjusting the acceptor concentration of mercury cadmium telluride has been discovered, using the acceptor materials described above, which comprises the steps of contacting the body of mercury telluride with a quantity of the acceptor material and heating the body at a temperature of at least 550° C for a sufficient time to distribute the acceptor material within the body. Normally, the concentration of acceptor material will range from $10^{10}$ atoms per cubic centimeter to $10^{20}$ atoms per cubic centimeter. The acceptor material is present in the lattice sites and in fact substitutes for tellerium in the mercury cadmium telluride crystal. As a preferred embodiment, it is desirable to perform the heating step at a temperature of at least 625° C. In all cases, the heat should not reach the solidus temperature, which for mercury cadmium telluride varies with the amount of the respective constituents, but does not reach 700° C. This heating step should be carried out for a sufficient time to distribute the acceptor material within the body. Preferably, at least 120 hours of heating is desirable for penetration of >100 um, and most preferably, a shorter time to provide distribution to only a few microns as desired for pv photodetectors.

In another embodiment of the present invention, the heating step should be carried out in the presence of a mercury vapor pressure derived from a source other than the mercury cadmium telluride body itself. This is normally done by placing a quantity of mercury in the heating chamber.

For a more complete understanding of the invention, reference is hereby made to the drawings, in which.

Figure 1:
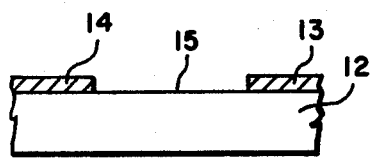
FIGS. 1, 2, 3 and 4 show schematically, in section, the method of the present invention.

As shown in FIG. 1, a semiconductor body 12 made from mercury cadmium telluride is masked with masks 13 and 14 to provide a surface 15 for treatment according to the present invention.

Figure 2:
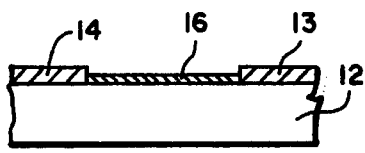

In FIG. 2, a quantity 16 of an acceptor material selected from the group consisting of phosphorus, arsenic and antimony is placed in the contact with the body 12 of mercury cadmium telluride.

Figure 3:
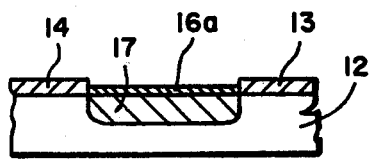

FIG. 3 shows the effect of heating at an elevated temperature of at least 550° C for a sufficient time to distribute the acceptor material into a region 17 of the body 12, leaving an undiffused portion 16a on the surface.

Figure 4:
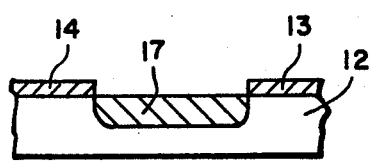

In FIG. 4, the undiffused acceptor material has been removed, leaving a body 12 of mercury cadmium telluride having a region 17 which is higher in acceptor concentration. If, for example, the body 12 is N-type material, and sufficient acceptor material has been diffused into the region 17 to render that region P-type, the junction between the body 12 and the region 17 provides a PN junction. Similarly, if the first region 12 of the body is P-type, additional acceptor concentration in region 17 gives rise to a P−P+ type junction.

Figure 5:
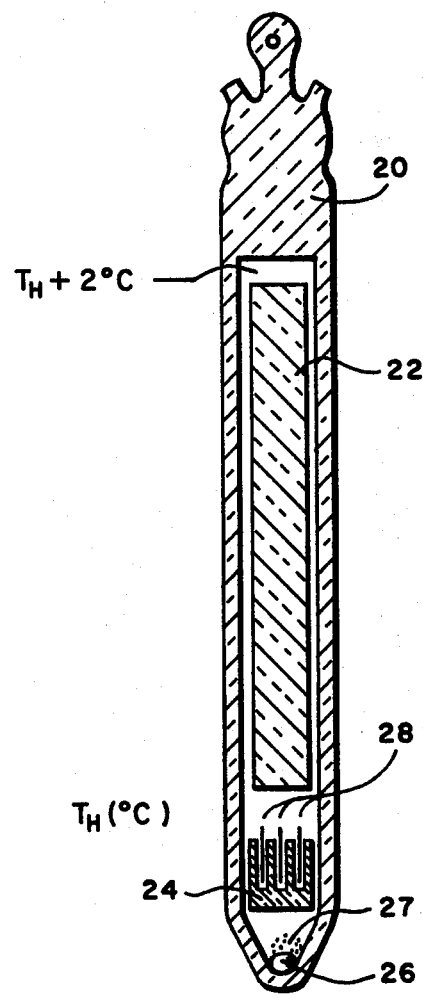
FIG. 5 shows an apparatus useful for performing the present invention.

FIG. 5 is a sectioned view of an apparatus useful for forming the products of the present invention. A fused quartz ampule 20 contains a quartz plug 22 in order to reduce volume to a level which is adequate for the purposes of this invention. A sample rack 24 is placed near the bottom of the ampule 20 to hold samples 28. The ampule is then placed in a furnace for heating at the desired temperature for the amount of time required. As mentioned above, in a preferred embodiment, it is desirable to place a quantity of mercury 26 in the ampule 20 to insure that a mercury vapor pressure exists from a source other than the samples themselves. This is done to insure that the stoichiometric relationships between the mercury, cadmium and tellurium in the samples is not disturbed at the high temperatures used in the process of this invention. It is also a preferred embodiment to include a quantity of powdered mercury cadmium telluride 27 as a further source of vapor pressure so as to prevent disturbance of the stoichiometric balance in the crystals being treated.

As stated above, the samples are heated at a temperature $T_H$ for a period of time sufficient to permit diffusion of the acceptor material into the mercury cadmium telluride crystal. This temperature, as stated above, will range from at least 550° C to slightly less than the solidus temperature, normally less than 700° C. A preferred range is from 625° to 675° C. Most preferred is approximately 650° C. The upper portion of the ampule 20 is maintained at a slightly higher temperature, $T_H + 2°$ C as shown in FIG. 5, to provide a thermal driving force in the direction of diffusion. The quartz plug 22 fills a substantial portion of the volume of the ampule 20 so that smaller quantities of mercury 26 are needed to provide a suitable mercury vapor pressure.

Figure 6:
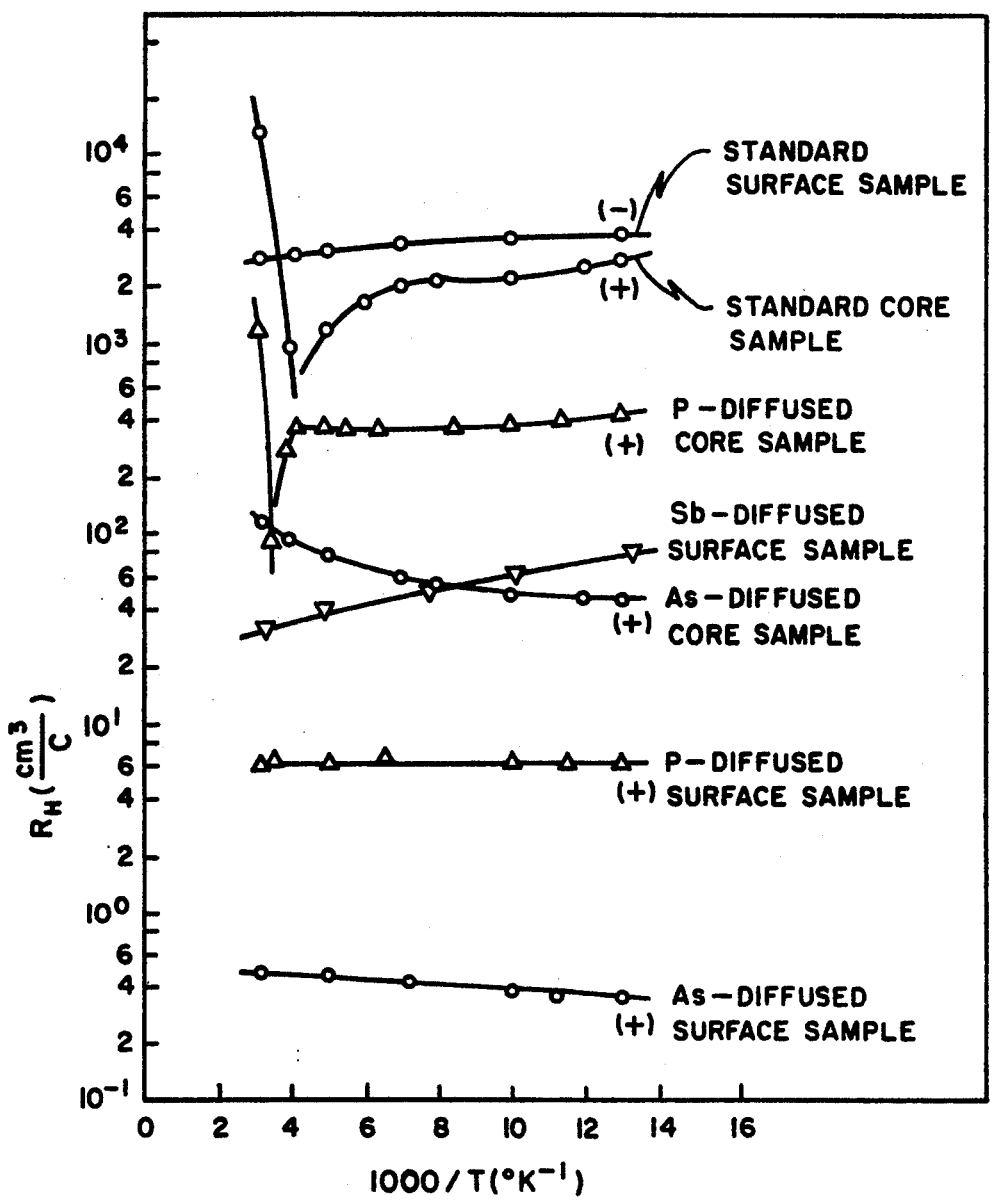
FIG. 6 shows the Hall coefficient versus inverse temperature for samples of the present invention compared to standard samples.

FIG. 6 shows the Hall coefficient plotted versus inverse temperature for various samples which have been treated according to the process of this invention. Also shown are standard surface samples. Carrier concentration is approximately $6.25 \times 10^{18} R_H$. It can readily be concluded from the data presented in FIG. 6 that phosphorous, arsenic and antimony are indeed suitable acceptor materials.

When an undoped sample of mercury cadmium telluride is heated at approximately 650° C for a period of time, followed by cooling down at a rate of roughly 30° C, an undoped material produces an N-type layer of approximately 100 microns thick with a carrier concentration of approximately $2 \times 10^{15}$ atoms per cubic centimeter. Thus, the carrier type and concentration in the skin layer when an impurity is present, provides a sensitive indicating of impurity doping effects.

Various methods have been employed to contact the acceptor material with the mercury cadmium telluride body. The phosphorus and arsenic were introduced in elemental form to be vaporized at the diffusion temperature inside sealed ampules.

An essential part of each diffusion experiment is the ability to distinguish the impurity effects from other changes produced by heat treatment or lattice change. For this reason, in every experiment an identical sample of the same mercury cadmium telluride was subjected to the same heat treatment for comparison.

Electrical measurements on Hall samples have been taken near the surface and from the center or core of various phosphorus, arsenic and Sb doped samples prepared according to the present invention. These samples show that phosphorus arsenic and antimony are acceptors. The 650° C heating treatments of impurity contacted material show approximately $10^{17}$ to $10^{18}$ atoms per cubic centimeter of phosphorous, arsenic, and antimony have been diffused into the samples. The phosphorus and arsenic diffused samples taken from the core regions, furthest from the surface being contacted with the acceptor material, have lower carrier concentrations, indicating that diffusion of phosphorus and arsenic into the core region had not yet reached equilibrium. Diffusion of antimony at 650° C for 1 week followed by a slow cool to room temperature was performed using an evaporated antimony source layer on ion scrubbed mercury cadmium tellurde. Other experiments were performed at temperatures of approximately 300° C for antimony, 250° C for arsenic and 250° C for phosphorus. In all cases, no electrical activity was found due to the impurity. In other words, the undoped samples behaved identically with the low temperature doped samples.

The conclusion from these experiments is that all three elements are acceptors. High temperatures of at least 550° C are necessary to produce the doping effects. Electrical measurements on thin samples of phosphorus, arsenic and antimony show that the impurity penetration is quite shallow. This demonstrates that the electrical effects are produced by diffusion at high temperature and are not due to the activation to substitutional sites of interstitial impurity which was distributed throughout the crystal at lower temperatures. The electrical activity of these impurities is consistent with substitution on the tellurium sublattice. The difficulty in introducing these impurities may be correlated with the substitution on the tellurium sublattice. It has become apparent from these experiments that the difficulty in diffusing materials into cadmium telluride is caused by a size effect. The mercury cadmium telluride lattice has a large binding energy contribution from ionic bonding. It is not inappropriate to consider the ionic radii of the metal and tellurium sublattices and of the various impurities. It is generally thought that the tellurium sublattice occupies approximately four times the volume of the metal sublattice. It would, therefore, be difficult for an impurity from Group V atom to pass through the lattice by a metal vacancy related diffusion mechanism. Thus, only tellurium vacancy coupled diffusion is available for tellurium site impurities. The low diffusion rates are therefore entirely consistent with a low tellurium vacancy concentration in the crystal. This conclusion is confirmed by diffusion at approximately 300° for a period of up to 2 weeks, resulting in no change in electrical properties contributed to the doping effects.

We have seen that phosphorous, arsenic and antimony are acceptors with high solubilities in mercury cadmium telluride. The high solubility implies the diffusion is not source limited. Electrical activity of phosphorous, arsenic and antimony is as expected for impurities substituted on the tellurium sublattices. Nitrogen is thought to be suitable for use with ion implantation to readily add acceptors to mercury cadmium telluride.

Although this invention has been described with reference to a series of preferred embodiments, workers skilled in the art will recognize that modifications may be made without departing from the spirit and scope of the present invention.

The embodiments of the invention in which an exclusive property or right is claimed are defined as follows:

1. A method of adjusting the acceptor concentration in a body of mercury cadmium telluride, comprising the steps of:
   contacting a body of mercury cadmium telluride with a quantity of acceptor material selected from the group consisting of phosphorus, arsenic and antimony; and
   heating said body at a temperature of at least 550° C for a sufficient time to distribute said acceptor material within said body.

2. The composition of claim 1 wherein said quantity of acceptor material ranges from $10^{10}$ atoms per cubic centimeter to $10^{20}$ atoms per cubic centimeter.

3. The composition of claim 1 wherein said acceptor material is present at the lattice sites in said mercury cadmium telluride.

4. The composition of claim 1 wherein said acceptor material is substituted for tellurium in said mercury cadmium telluride.

5. The composition of claim 1 wherein said acceptor material is phosphorus.

6. The composition of claim 1 wherein said acceptor material is arsenic.

7. The composition of claim 1 wherein said acceptor material is antimony.

8. The method of claim 1 wherein said temperature ranges from 625° to 675° C for at least 24 hours.

9. The method of claim 1 wherein said time ranges from 150 to 180 hours.

10. The method of claim 1 which further includes the step of providing a mercury vapor pressure during said heating from a source other than said mercury cadmium telluride.

11. A method of increasing the acceptor concentration of a first region of mercury cadmium telluride with respect to a second adjacent region of mercury cadmium telluride comprising the steps of:
   contacting said first region of mercury cadmium telluride with a quantity of acceptor material selected from the group consisting of phosphorous, arsenic and antimony; and heating said body at a temperature of at least 550° C for a sufficient time to distribute said acceptor material within said body.

12. The composition of claim 11 wherein said quantity of acceptor material ranges from $10^{10}$ atoms per cubic centimeter to $10^{20}$ atoms per cubic centimeter.

13. The composition of claim 11 wherein said acceptor material is present at the lattice sites in said mercury cadmium telluride.

14. The composition of claim 11 wherein said acceptor material is substituted for tellurium in said mercury cadmium telluride.

15. The composition of claim 11 wherein said acceptor material is phosphorus.

16. The composition of claim 11 wherein said acceptor material is arsenic.

17. The composition of claim 11 wherein said acceptor material is antimony.

18. The method of claim 11 wherein said temperature ranges from 625° to 675° C for at least 24 hours.

19. The method of claim 11 wherein said time ranges from 150 to 180 hours.

20. The method of claim 11 which further includes the step of providing a mercury vapor pressure during said heating from a source other than said mercury cadmium telluride.

* * * * *